United States Patent
Reill et al.

(10) Patent No.: US 10,411,168 B2
(45) Date of Patent: Sep. 10, 2019

(54) SEMICONDUCTOR COMPONENT HAVING A SMALL STRUCTURAL HEIGHT

(71) Applicant: OSRAM Opto Semiconductors GmbH, Regensburg (DE)

(72) Inventors: Joachim Reill, Zeitlarn (DE); Frank Singer, Regenstauf (DE); Norwin von Malm, Nittendorf (DE); Matthias Sabathil, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 184 days.

(21) Appl. No.: 14/779,818

(22) PCT Filed: Mar. 24, 2014

(86) PCT No.: PCT/EP2014/055836
§ 371 (c)(1),
(2) Date: Sep. 24, 2015

(87) PCT Pub. No.: WO2014/154632
PCT Pub. Date: Oct. 2, 2014

(65) Prior Publication Data
US 2016/0056344 A1 Feb. 25, 2016

(30) Foreign Application Priority Data
Mar. 28, 2013 (DE) .......................... 10 2013 103 226

(51) Int. Cl.
*H01L 33/48* (2010.01)
*H01L 33/54* (2010.01)
(Continued)

(52) U.S. Cl.
CPC .......... *H01L 33/486* (2013.01); *H01L 33/005* (2013.01); *H01L 33/54* (2013.01);
(Continued)

(58) Field of Classification Search
CPC ... H01L 2924/00; H01L 33/486; H01L 33/62; H01L 23/49805
(Continued)

(56) References Cited

U.S. PATENT DOCUMENTS

2004/0046242 A1* 3/2004 Asakawa ............ H01L 31/0203
257/678
2004/0240203 A1* 12/2004 Matsumura ......... H01L 25/0753
362/227
(Continued)

FOREIGN PATENT DOCUMENTS

DE 10 2009 036 621 A1 2/2011
DE 10 2011 011 139 A1 8/2012
(Continued)

OTHER PUBLICATIONS

Chinese Office Action dated Dec. 20, 2016, of corresponding Chinese Application No. 201480018527.5 in English.
(Continued)

*Primary Examiner* — David Chen
(74) *Attorney, Agent, or Firm* — DLA Piper LLP (US)

(57) ABSTRACT

An optoelectronic semiconductor component includes a semiconductor chip having a semiconductor layer sequence including an active region that generates radiation; a radiation exit surface running parallel to the active region; a mounting side surface that fixes the semiconductor component and runs obliquely or perpendicularly to the radiation exit surface and at which at least one contact area for external electrical contacting is accessible; a molded body molded onto the semiconductor chip in places and forming the mounting side surface at least in regions; and a contact track arranged on the molded body and electrically conductively connecting the semiconductor chip to the at least one contact area.

11 Claims, 11 Drawing Sheets

(51) Int. Cl.
*H01L 33/62* (2010.01)
*H01L 33/00* (2010.01)
*H01L 33/60* (2010.01)
*H01L 23/498* (2006.01)

(52) U.S. Cl.
CPC .............. *H01L 33/60* (2013.01); *H01L 33/62* (2013.01); *H01L 23/49805* (2013.01); *H01L 2924/0002* (2013.01); *H01L 2933/005* (2013.01); *H01L 2933/0033* (2013.01)

(58) Field of Classification Search
USPC .................... 257/99, 433, E31.117, E33.059
See application file for complete search history.

(56) References Cited

U.S. PATENT DOCUMENTS

| | | |
|---|---|---|
| 2005/0093146 A1 | 5/2005 | Sakano |
| 2006/0220233 A1 | 10/2006 | Ito et al. |
| 2008/0080194 A1* | 4/2008 | Su .......................... H01L 33/486 362/362 |
| 2008/0173884 A1 | 7/2008 | Chitnis et al. |
| 2009/0134411 A1* | 5/2009 | Kitani ................... H01L 33/486 257/98 |
| 2009/0179219 A1* | 7/2009 | Kim ...................... H01L 33/486 257/99 |
| 2009/0315068 A1 | 12/2009 | Oshio et al. |
| 2011/0079801 A1 | 4/2011 | Zhang et al. |
| 2011/0170303 A1 | 7/2011 | Wu et al. |
| 2012/0025257 A1* | 2/2012 | Wu .......................... H01L 33/62 257/99 |
| 2014/0034983 A1 | 2/2014 | Gebuhr et al. |
| 2014/0284645 A1 | 9/2014 | Weidner et al. |

FOREIGN PATENT DOCUMENTS

| | | |
|---|---|---|
| JP | 2002-064112 | 2/2002 |
| JP | 2003-168762 | 6/2003 |
| JP | 2006-032440 | 2/2006 |
| JP | 2008-160106 | 7/2008 |
| JP | 2010-517290 | 5/2010 |
| JP | 2012-504318 | 2/2012 |
| WO | 2006/083110 A1 | 8/2006 |
| WO | 2008/038997 A1 | 4/2008 |

OTHER PUBLICATIONS

Notice of Reasons for Rejection dated Aug. 9, 2016, of corresponding Japanese Application No. 2016-504613 in English.

"CUW YASH—Micro SIDELED 4206", Datasheet, Draft Version, OSRAM Opto Semiconductors GmbH, Mar. 18, 2013.

* cited by examiner

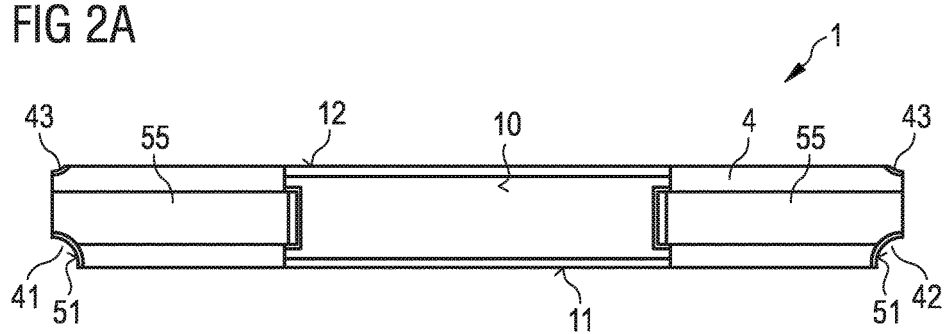
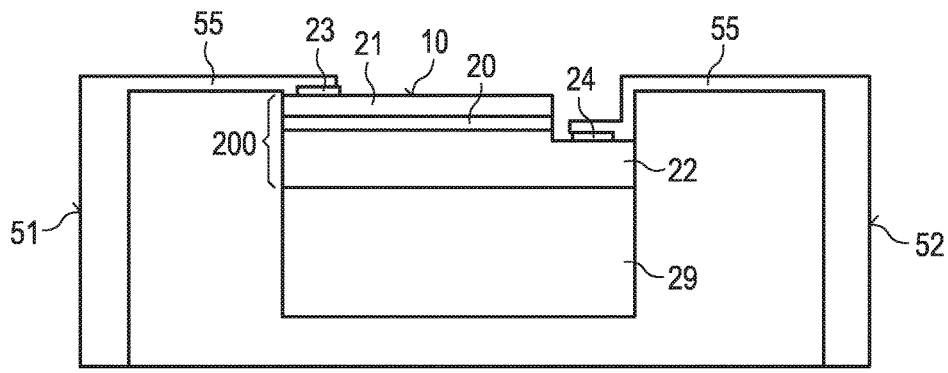

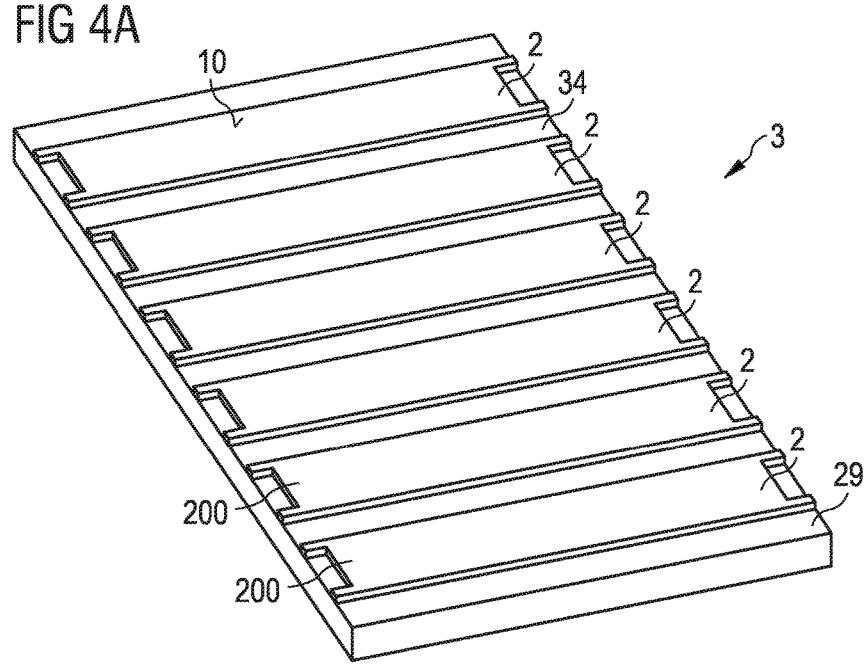
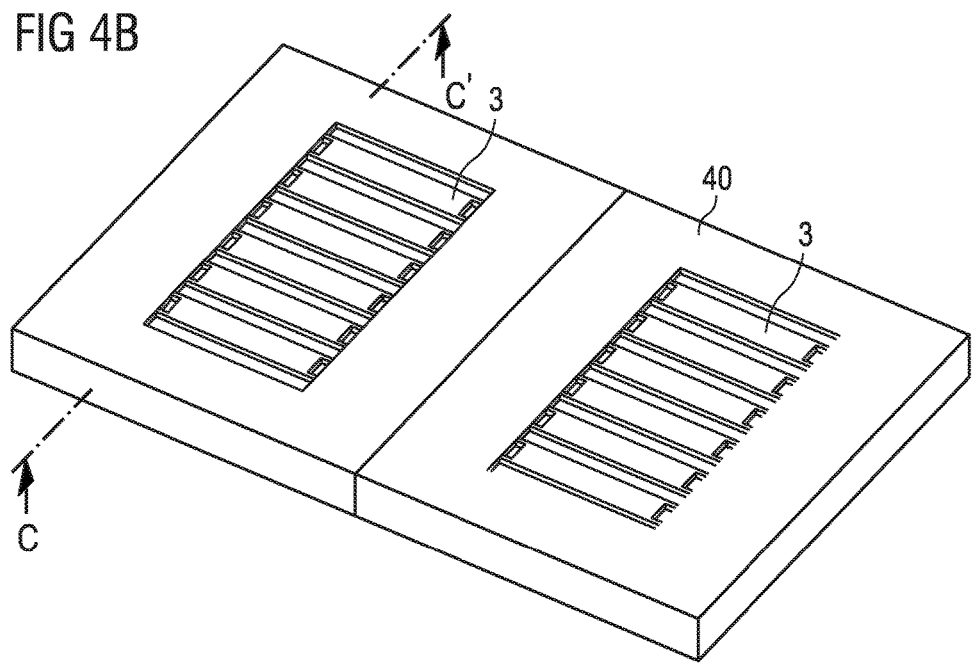

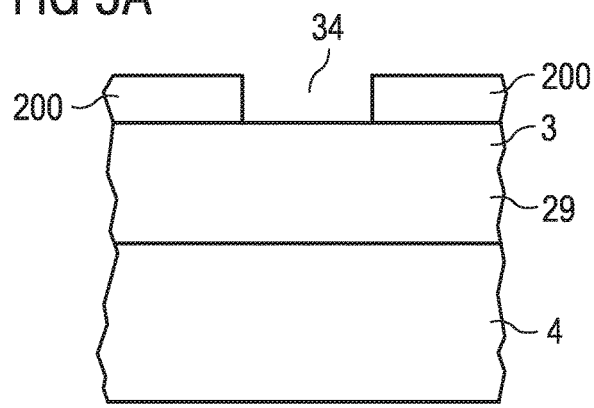
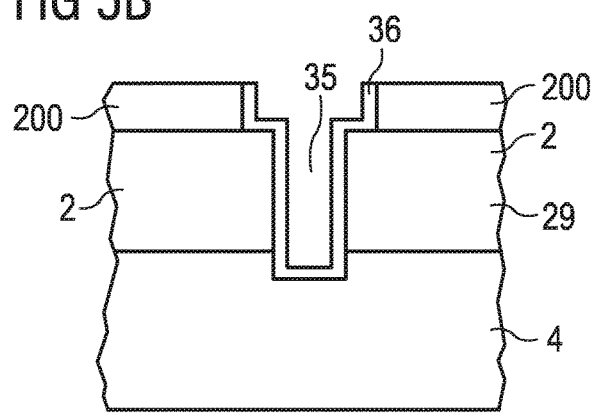
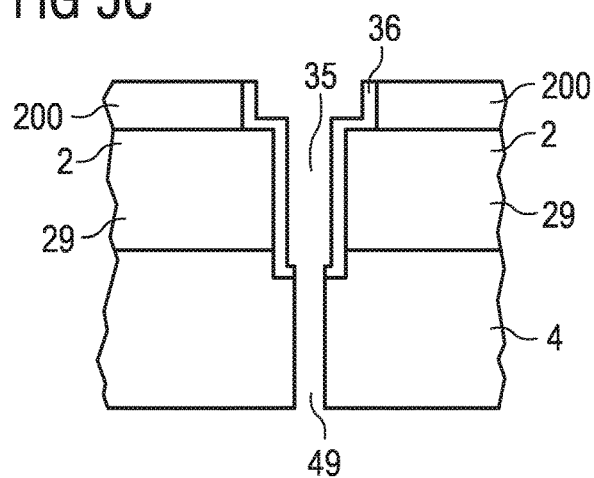

SEMICONDUCTOR COMPONENT HAVING A SMALL STRUCTURAL HEIGHT

TECHNICAL FIELD

This disclosure relates to an optoelectronic semiconductor component and to a method of fabricating an optoelectronic semiconductor component.

BACKGROUND

Liquid crystal displays that are backlit by LEDs are often employed in handheld electronic devices such as mobile radio devices, for example. A reduction of the structural depth of such devices also gives rise to requirements made of the structural height of the LEDs which are not readily achievable with conventional designs.

It could therefore be helpful to provide an optoelectronic semiconductor component distinguished by a small structural height and simultaneously offering a luminous flux sufficient for the application of the device. Furthermore, it could be helpful to provide a method by which such an optoelectronic semiconductor component can be fabricated simply and cost-effectively.

SUMMARY

We provide an optoelectronic semiconductor component including a semiconductor chip having a semiconductor layer sequence comprising an active region that generates radiation; a radiation exit surface running parallel to the active region; a mounting side surface that fixes the semiconductor component and runs obliquely or perpendicularly to the radiation exit surface and at which at least one contact area for external electrical contacting is accessible; a molded body molded onto the semiconductor chip in places and forming the mounting side surface at least in regions; and a contact track arranged on the molded body and electrically conductively connecting the semiconductor chip to the at least one contact area.

We further provide a method of fabricating a semiconductor chip including providing a plurality of semiconductor chips each having a semiconductor layer sequence comprising an active region that generates radiation; regionally encapsulating the semiconductor chips with a molding compound to form a molded body assemblage; forming a structured coating on the molded body assemblage for electrically contacting the semiconductor chips; and singulating the molded body assemblage into a plurality of semiconductor components having a semiconductor chip and at least one contact area formed by the coating, wherein a side surface of the singulated molded bodies arising during singulating forms a mounting side surface of the semiconductor component, at which the at least one contact area for external electrical contacting is accessible.

We yet further provide an optoelectronic semiconductor component including a semiconductor chip having a semiconductor layer sequence comprising an active region that generates radiation; a radiation exit surface running parallel to the active region; a mounting side surface that fixes the semiconductor component and runs obliquely or perpendicularly to the radiation exit surface and at which at least one contact area for external electrical contacting is accessible; a molded body molded onto the semiconductor chip in places and forming the mounting side surface at least in regions; and a contact track arranged on the molded body and electrically conductively connecting the semiconductor chip to the at least one contact area, wherein the semiconductor chip has a carrier on which the semiconductor layer sequence is arranged; and the molded body covers at least in regions a rear side of the carrier facing away from the semiconductor layer sequence.

BRIEF DESCRIPTION OF THE DRAWINGS

FIGS. 2A and 2B show a second example of a semiconductor component in schematic side view (FIG. 2A) and schematic sectional view (FIG. 2B).

FIGS. 3A to 3E show a third example of a semiconductor component in perspective view (FIG. 3A), in sectional view (FIG. 3D) and in enlarged detail illustration of an excerpt from FIG. 3D (FIG. 3E), wherein FIGS. 3B and 3C show a variant of the rear side of the semiconductor component, the rear side not being visible in FIG. 3A.

FIGS. 4A to 4F show one example of a method of fabricating a semiconductor component on the basis of schematically illustrated intermediate steps in perspective view (FIGS. 4A, 4B and 4D to 4F) and in sectional view (FIG. 4C).

FIGS. 5A to 5C show one example of intermediate steps of a method of fabricating a semiconductor component in schematic sectional view.

DETAILED DESCRIPTION

Figure 1A:
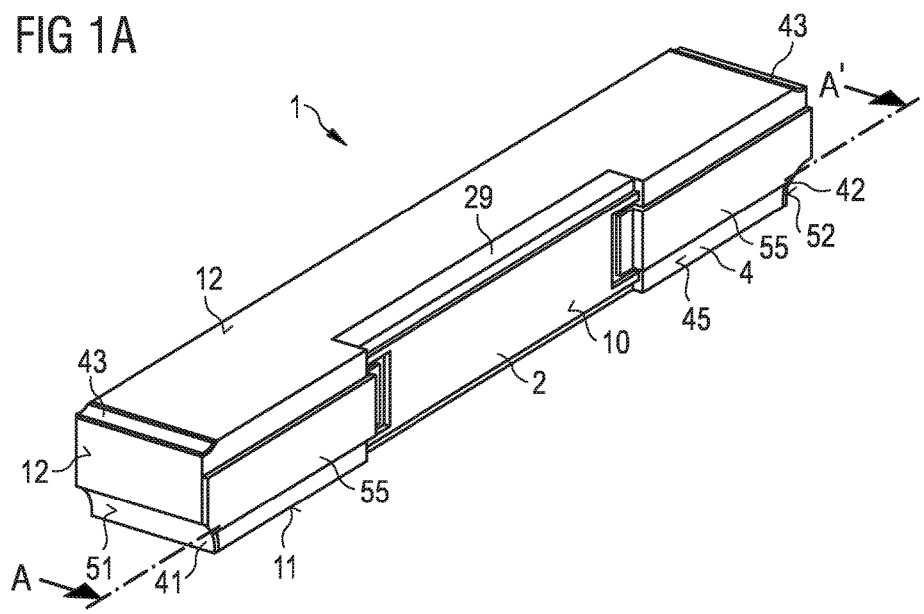
FIGS. 1A and 1B show one example of an optoelectronic semiconductor component in schematic perspective illustration (FIG. 1A) and schematic sectional view (FIG. 1B).

We provide an optoelectronic semiconductor component having a semiconductor chip, which has a semiconductor layer sequence comprising an active region provided to generate radiation. The active region is provided in particular to generate radiation in the visible, ultraviolet or infrared spectral range. The semiconductor layer sequence has, for example, a first semiconductor layer of a first conduction type and a second semiconductor layer of a second conduction type different from the first conduction type. The active region is arranged between the first semiconductor layer and the second semiconductor layer. To electrically contact the semiconductor chip, the semiconductor chip expediently has a first contact and a second contact. In particular, the first contact electrically contacts the first semiconductor layer and the second contact electrically contacts the second semiconductor layer. The contacts can be formed in each case as partial regions of the first semiconductor layer and the second semiconductor layer, respectively, or as additional layers, for example, metal layers that electrically conductively connect to these layers.

A radiation exit surface of the semiconductor component may run parallel to the active region, that is to say parallel to a main extension plane of the active region. In particular, the optoelectronic semiconductor component has exactly one radiation exit surface. By way of example, the radiation exit surface is formed in a planar fashion. In this context "planar" means, in particular, that the radiation exit surface is free of ends. However, the planar radiation exit surface can be provided with a structuring, for instance a roughening, for example, to increase the coupling-out efficiency.

The semiconductor component may have a mounting side surface to fix the semiconductor component and runs obliquely or perpendicularly to the radiation exit surface. In particular, the radiation exit surface runs perpendicularly or substantially perpendicularly to the mounting side surface. "Substantially perpendicularly" is understood to mean a deviation of at most 10° with respect to the perpendicular orientation. A contact area for external electrical contacting of the semiconductor component is accessible at the mounting side surface. During mounting of the optoelectronic semiconductor component on a connection carrier, during which the mounting side surface faces the connection carrier, external electrical contacting of the contact area with the connection carrier can thus be carried out. The semiconductor component is in particular a surface-mountable component (surface mounted device, smd).

The semiconductor component may have a molded body molded onto the semiconductor chip in places. In particular, the molded body forms the mounting side surface at least in regions. The molded body forms all the side surfaces of the semiconductor component in particular at least in regions. In case of doubt, the side surfaces are understood to be those outer surfaces of the semiconductor component running obliquely or perpendicularly to the radiation exit surface. In other words, the side surfaces and in particular the mounting side surface run between a rear side facing away from the radiation exit surface and a front side of the molded body situated opposite the rear side. At the places at which the molded body is molded onto the semiconductor chip, the molded body in particular directly adjoins the semiconductor chip. The radiation exit surface of the semiconductor component is expediently free of the molded body. The molded body is designed to be non-transmissive in particular for radiation generated in the active region. However, the molded body can also be designed to be transparent or at least translucent for the radiation.

The semiconductor component may have a contact track. The contact track electrically conductively connects the semiconductor chip to the at least one contact area. The contact track is arranged in particular on the molded body, for example, on the front side of the molded body or on the rear side of the molded body.

The semiconductor component may have a semiconductor chip having a semiconductor layer sequence comprising an active region to generate radiation. The semiconductor component furthermore has a radiation exit surface running parallel to the active region. Furthermore, the semiconductor component comprises a mounting side surface to fix the semiconductor component and runs obliquely or perpendicularly to the radiation exit surface and at which at least one contact area for external electrical contacting is accessible. The semiconductor component furthermore has a molded body molded onto the semiconductor chip in places and forms the mounting side surface at least in regions. A contact track is arranged on the molded body, the contact track electrically conductively connecting the semiconductor chip to the at least one contact area.

The semiconductor component may have a rectangular basic shape with at least one indentation in a plan view of the radiation exit surface. In particular, the at least one contact area is arranged in the at least one indentation. The at least one indentation is accessible in particular from the mounting side surface. The indentation has, for example, substantially the shape of a part of a circle. Such indentations can be fabricated in a simple manner. In principle, however, a different basic shape can also be employed for the indentation. The at least one indentation is formed, for example, in a corner of the rectangular basic shape. The regions of the rectangular basic shape that run straight in plan view are, in particular, free of the material of the contact area.

The molded body may have a further indentation. Expediently, a further contact area is formed in the further indentation such that as a result of an external electrical voltage being applied between the contact area and the further contact area charge carriers are injected from different sides into the active region of the semiconductor chip and recombine there with emission of radiation.

By way of example, the further indentation is formed in a further corner of the rectangular basic shape, wherein the mounting side surface runs in particular between the corner and the further corner. Two contacts for the external electrical contacting of the semiconductor component are thus available in the region of the two corners. The basic shape can also have an indentation in more than two corners, in particular at all corners. By way of example, the molded body has top-side indentations on the side surface opposite the mounting side surface. The top-side indentations can be provided with an electrically conductive coating. The coating can be electrically insulated from the at least one contact track in the region of the top-side indentations. In this case, therefore, the coating of the top-side indentations does not serve for electrical contacting. The mounting can therefore take place only on the mounting side surface, thereby ruling out any mix-up of the sides. However, it is also possible for at least one of the top-side indentations, in particular two indentations, to be electrically conductively connected to the semiconductor chip. Consequently, an in particular surface-mounted mounting can also be carried out on the side surface opposite the mounting side surface.

The semiconductor chip may have a carrier on which the semiconductor layer sequence is arranged. The carrier is thus part of the semiconductor chips. The semiconductor chips have the carrier during fabrication in particular already even before the semiconductor chips emerge from a wafer assemblage by singulation.

The carrier may be a growth substrate for the, for example, epitaxial deposition of the semiconductor layers of the semiconductor layer sequence.

Alternatively, the carrier may be different from the growth substrate. The growth substrate can be removed or thinned over the whole area or at least in regions. The carrier mechanically stabilizes the semiconductor layer sequence such that the growth substrate is no longer required for this purpose. A semiconductor chip in which the growth substrate is removed is also designated as a thin-film semiconductor chip. Such a semiconductor chip constitutes to a good approximation a surface emitter having a Lambertian emission characteristic. By way of example, the semiconductor layer sequence is fixed to the carrier by a connection layer. By way of example, an adhesive layer or a solder layer is suitable as a connection layer.

The molded body may cover completely or at least in regions a rear side of the carrier facing away from the semiconductor layer sequence. The semiconductor chip is therefore covered with material of the molded body at least in places on the rear side facing away from the radiation exit surface.

The carrier and the molded body may terminate flush at at least one side surface of the semiconductor component, for example, at the mounting side surface. In particular, the carrier and the molded body terminate flush at two opposite side surfaces of the semiconductor component. The carrier and the molded body thus jointly form at least one side surface of the semiconductor component. At the exposed places of the carrier, therefore, the semiconductor chip is not embedded into the molded body. During fabrication of the semiconductor component, the side surface of the semiconductor component can be formed in a singulating step in which the molded body and the carrier are severed in a common step.

The molded body may adjoin all side surfaces of the carrier. In particular, the molded body adjoins the carrier at the mounting side surface and at the side surface opposite the mounting side surface. In this case, therefore, the semiconductor chip is embedded into the molded body along all side surfaces at least in regions or completely.

The semiconductor chip may have two contacts on the front side of the carrier facing the semiconductor layer sequence. The contacts connect to a contact area of the semiconductor component in particular in each case via a contact track. The contact tracks run, for example, on a common main surface of the molded body. The front side and the rear side of the molded body are designated as main surfaces. In particular, the contact tracks run on the front side of the molded body. The contacts can be formed laterally with respect to the semiconductor layer sequence on the carrier. In this case, the radiation exit surface of the semiconductor layer sequence facing away from the carrier is totally free of contact material. The risk of shading of the radiation generated in the active region can thus be reduced. Alternatively, one of the contacts or both contacts can be arranged on the semiconductor layer sequence.

The semiconductor chip in each case may have a contact on the front side of the carrier facing the semiconductor layer sequence and on the rear side of the carrier facing away from the semiconductor layer sequence. The contacts connect to a contact area in each case via a contact track, wherein the contact tracks run on opposite main surfaces of the molded body. By way of example, the molded body has a contact opening at the rear side, in which contact opening the rear side of the carrier is accessible for an electrical contact with the contact track.

The molded body may be reflective for the radiation generated in the semiconductor chip. Preferably, the reflectivity for a peak wavelength of the radiation generated in the active region is at least 60%, preferably at least 80%. Radiation emitted in the direction of the molded body can thus be reflected back into the semiconductor chip and subsequently emerge from the semiconductor component through the radiation exit surface.

The semiconductor chip may have a depression running at least in regions along the circumference of the semiconductor chip, for example, along the entire circumference of the semiconductor chip. By way of example, the depression extends into the carrier.

In particular, the molded body extends into the depression at least in regions. A positively locking connection between the semiconductor chip and the molded body can thus be obtained in a simple manner and the mechanical stability of the connection between the semiconductor chip and the molded body can be increased.

A method of fabricating a semiconductor component has a step involving providing a plurality of semiconductor chips, which in each case have a semiconductor layer sequence comprising an active region to generate radiation.

The method may comprise a step involving regionally encapsulating the semiconductor chips with a molding compound to form a molded body assemblage. The encapsulating can be carried out by molding, for example, wherein the term molding generally denotes methods of applying a molding compound and encompasses in particular injection molding, transfer molding and compression molding.

The method may comprise a step involving forming an in particular electrically conductive coating on the molded body assemblage to electrically contact the semiconductor chips. The coating is formed in a structured fashion to contact the semiconductor chips, that is to say not over the whole area. The coating can be formed, for example, by vapor deposition or sputtering. In a later step, the thickness of the electrically conductive coating can be increased in particular for the purpose of increasing the electrical conductivity, for example, by electrodeposition or electroless deposition.

The method may comprise a step involving singulating the molded body assemblage into a plurality of semiconductor components having in each case a semiconductor chip and at least one contact area formed by the coating, wherein a side surface of the singulated molded bodies that arises during singulating forms a mounting side surface of the semiconductor component, at which the at least one contact area for external electrical contacting is accessible. The singulating is carried out in particular only after the coating has been applied such that the side surfaces of the semiconductor components arising during singulating are free of material for the coating. The singulating can be carried out, for example, by a mechanical method, for example, sawing or by coherent radiation, for instance, by laser separation.

A plurality of semiconductor chips may be provided, which in each case have a semiconductor layer sequence comprising an active region to generate radiation. The semiconductor chips are regionally encapsulated with a molding compound to form a molded body assemblage. A coating is formed on the molded body assemblage to electrically contact the semiconductor chips. The molded body assemblage is singulated into a plurality of semiconductor components, wherein the semiconductor components in each case have a semiconductor chip and at least one contact area and wherein a side surface of the singulated molded bodies that arises during singulating forms a mounting side surface of the semiconductor component, at which the at least one contact area formed by the coating for external electrical contacting is accessible.

The molded body assemblage before the process of forming the coating may have in each case at least one recess between adjacent semiconductor chips, the at least one recess being provided with the coating. The recesses can extend completely through or only regionally through the molded body assemblage. The molded body assemblage can be formed such that the molded body assemblage already has the recesses. Alternatively, the recesses can be introduced into the molded body assemblage by material removal after the process of forming the molded body assemblage and before the process of applying the coating, for example, mechanically for instance by drilling or by coherent radiation.

The process of singulating the molded body assemblage may be carried out through the recesses. In particular, singulating may be carried out such that the singulated semiconductor components have a rectangular basic shape with at least one indentation. In particular, the semiconductor components can have an indentation at each corner of the rectangular basic shape. In this case, the width of the singulating cut is smaller than the extent of the recesses transversely with respect to the singulating cut.

The process of providing the semiconductor chips may involve providing a plurality of semiconductor chip assemblages comprising in each case a plurality of continuous semiconductor chips. The semiconductor chip assemblages can have in particular a common continuous carrier. A wafer from which the later semiconductor chips emerge is thus first singulated into segments which each form a semiconductor chip assemblage and comprise a plurality of semiconductor chips not yet singulated. The semiconductor chip assemblages are singulated only after the process of encapsulating with the molding compound. In other words, the process of singulating the semiconductor chip assemblages in semiconductor chips is carried out only in the course of the step of singulating the molded body assemblage into the semiconductor components.

The semiconductor chip assemblages may be singulated before the process of singulating the molded body assemblage. When the molded body assemblage is singulated, therefore, the semiconductor chip assemblages have already been singulated into semiconductor chips.

For the purpose of singulating the semiconductor chip assemblages, trenches may be formed between adjacent semiconductor chips of a semiconductor chip assemblage. In particular, the subsequent process of singulating the molded body assemblage is carried out along with the trenches. The trenches extend in a vertical direction in particular completely through the semiconductor chip assemblage, but not through the entire molded body assemblage. The trenches are provided with a reflective material in particular at least in regions. The reflective material can be implemented, for example, by a deposition method, for instance vapor deposition or sputtering or by molding. When the trenches are formed, the semiconductor layer sequences of adjacent semiconductor chips may have already been separated from one another at least in regions, for example, by a trench-shaped recess, for instance, a mesa trench. By way of example, at least one or a plurality, in particular, all of the following layers is/are severed: the first semiconductor layer, the second semiconductor layer, the active region. The trenches run in particular along the trench-shaped recess.

The semiconductor chip assemblages may be singulated during the process of singulating the molded body assemblage. The process of singulating the semiconductor chip assemblages is thus carried out at the same time as the process of singulating the molded body assemblage. In this case, a part of the semiconductor chip and a part of the molded body respectively form the side surface of the semiconductor component that arises during singulation. The semiconductor chips and the molded body terminate flush at the side surface that arises during singulation.

The semiconductor chips may be provided as individual semiconductor chips. During the process of encapsulating with the molding compound, the semiconductor chips are at least regionally encapsulated at all side surfaces. Before the encapsulating process, the semiconductor chips can be provided with a reflective layer at least in regions at the side surfaces and/or at a rear side of the semiconductor chip opposite a radiation exit surface of the semiconductor chip.

The method described is particularly suitable for fabricating a semiconductor component described further above. Features mentioned in association with the semiconductor component can therefore also be used for the method, and vice-versa.

In the method described, the mounting side surface and furthermore also the side surface of the semiconductor component opposite the mounting side surface arise during the singulating step. The component height, that is to say the extent vertically with respect to the mounting side surface, is therefore determined by the distance between parallel separating lines during the singulating step and can therefore also assume particularly small values. In particular, the component height can be less than 500 µm. Preferably, the component height is 100 µm to 400 µm, particularly preferably 150 µm to 300 µm, for example, 200 µm to 250 µm. As a result, a particular compact semiconductor component can be provided which makes available a sufficient luminous flux during operation.

The molded bodies can be formed over a large area for a multiplicity of components in a common singulating step. In this case, in particular, the individual molded bodies arise only after the semiconductor chips have already been arranged within the molded body. The semiconductor chips thus need not be positioned in prefabricated housings and electrically contacted. Rather, the molded body forming the housing is formed only by singulation of the molded body assemblage with the semiconductor chips embedded therein.

Further configurations and expediencies will become apparent from the following description of the examples in association with the figures.

Elements that are identical, of identical type or act identically are provided with the same reference signs in the figures.

The figures are schematic illustrations and therefore not necessarily true to scale. Rather, comparatively small elements and in particular layer thicknesses may be illustrated with exaggerated size for elucidation purposes.

A first example of a semiconductor component 1 is shown in perspective illustration in FIG. 1A. The sectional view illustrated in FIG. 1B runs along the line AA' shown in FIG. 1A, although the individual elements are depicted with different size relationships with respect to one another to enable improved illustration in FIGS. 1A and 1B.

The semiconductor component 1 has a semiconductor chip 2 that generates radiation and comprises a semiconductor layer sequence 200. A surface of the semiconductor chip 2 forms a radiation exit surface 10 of the semiconductor component. A molded body 4 is molded onto the semiconductor chip 2. The molded body extends perpendicularly to the radiation exit surface 10 between a rear side 46 of the molded body opposite the radiation exit surface and a front side 45 of the molded body. Side surfaces 12 of the molded body 4 run between the rear side and the front side. One of the side surfaces is forming as a mounting side surface 11. The molded body can contain a polymer material or be formed from such material. By way of example, the polymer material can contain an epoxide, a silicone, PPA or polyester. The polymer material can be filled with in particular inorganic particles. The particles can, for example, contain glass, $TiO_2$, $Al_2O_3$ or ZrO or consist of such a material.

Contact tracks 55 are formed on the front side 45 of the molded body 4, the contact tracks electrically contacting a first contact 23 and respectively a second contact 24 of the semiconductor chip 2. Via the contact tracks 55, the first contact 23 electrically conductively connects to a contact area 51 and the second contact 24 electrically conductively connects to a further contact area 52. The contact areas are accessible from the mounting side surface 11 via an external electrical contacting of the semiconductor component 1.

At the mounting side surface 11 and the side surface 12 of the semiconductor component opposite the mounting side surface 11, the semiconductor chip 2 and the molded body 4 terminate flush with one another. The molded body and the semiconductor chip thus regionally form the side surface of the semiconductor component.

In the example shown, the semiconductor chip 2 has two contacts accessible from the front side 45 of the molded body. The semiconductor chip 2 comprises an active region 20 that generates radiation, the active region being arranged between a p-conducting first semiconductor layer 21 and an n-conducting second semiconductor layer 22. However, the first semiconductor layer and the second semiconductor layer can also be inverted with regard to the conduction type.

The semiconductor layer sequence 200 of the semiconductor chip is fixed to a front side 291 of a carrier 29 by a connection layer 28, for instance an adhesive layer or a solder layer. The semiconductor chip is a thin-film semiconductor chip in which the growth substrate for the epitaxial deposition of the semiconductor layer sequence is removed and therefore no longer present in the completed component. The contacts 23, 24 are arranged laterally with respect to the semiconductor layer sequence 200, in particular on opposite sides. The radiation exit surface of the semiconductor layer sequence 200 is thus free of contacts which might cause a shading of the radiation generated in the active region. The first semiconductor layer 21 electrically conductively connects to the first contact 23 via a first connection layer 25. The first connection layer is a mirror layer for the radiation generated in the active region. By way of example, the first connection layer contains silver, aluminum, palladium or rhodium or a metallic alloy comprising at least one of the materials mentioned. The materials mentioned are distinguished by a high reflectivity in the visible and ultraviolet spectral range. However, a different material can also be employed. Gold, for example, is suitable in the red and infrared spectral range.

A plurality of recesses 27 are formed in the semiconductor layer sequence, the recesses extending through the first semiconductor layer 21 and the active region 20 into the second semiconductor layer 22. In the recesses, the second semiconductor layer electrically conductively connects to a second connection layer 26. To avoid an electrical short circuit, the first semiconductor layer and the active region in the recesses are covered with an insulation layer 271. The insulation layer also insulates the first connection layer from the second connection layer. The first connection layer 25 and the second connection layer 26 regionally overlap one another in a plan view of the radiation exit surface 10 and are arranged between the semiconductor layer sequence 200 and the carrier 29.

A rear side 292 of the carrier 29 facing away from the semiconductor layer sequence is completely covered with the molded body 4. The rear side of the carrier forms the rear side of the semiconductor chip 2. In a plan view of the radiation exit surface 10 of the semiconductor component 1, the molded body has a rectangular basic shape. The molded body has an indentation 41 at a corner and a further indentation 42 at a further corner, wherein the mounting side surface 11 runs between the indentation 41 and the further indentation 42. The contact area 51 is formed in the indentation 41, and the further contact area 52 is formed in the further indentation 42. Top-side indentations 43 are formed on the side surface 12 opposite the mounting side surface. Although the side surfaces of these indentations are provided with an electrically conductive coating just like the side surfaces of the indentation 41 and of the further indentation 42, they do not serve to electrically contact the semiconductor component 1, in contrast to the indentation and to the further indentation.

The semiconductor chip 2 constitutes a surface emitter to a good approximation such that almost the entire radiation generated in the active region 20 emerges through the radiation exit surface 10. Therefore, the molded body 4 can also be designed to be non-transmissive, in particular absorbent, for the radiation generated in the active region. To increase the emitted radiation power more extensively, the molded body 4 can be reflective for the radiation. By way of example, the material of the molded body can be admixed with particles that increase reflectivity, for example, white pigments for instance titanium oxide. Alternatively, a coating with a reflective material can be employed. This will be described in greater detail in association with FIGS. 5A to 5C. During fabrication of the semiconductor component, the side surfaces 12 and in particular the mounting side surface 11 arise during singulation of an assemblage into the semiconductor components. The side surfaces can therefore have singulation traces, for example, sawing traces or traces of a laser separation method.

Figure 1B:
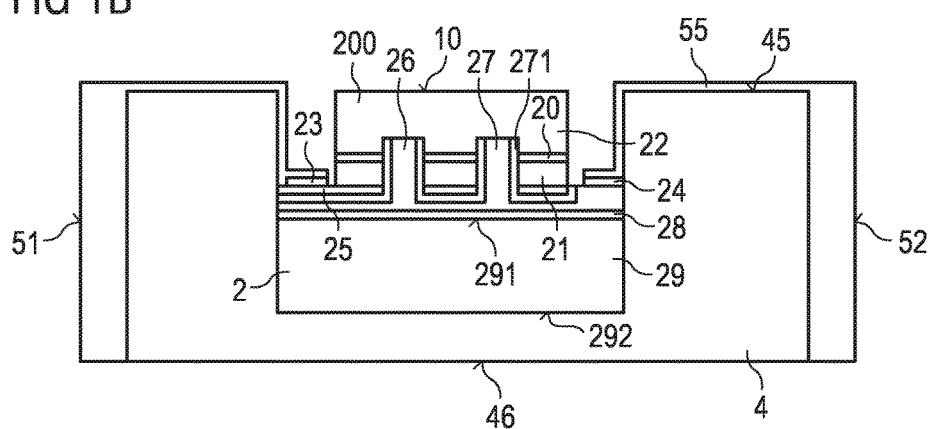
Figure 1C:
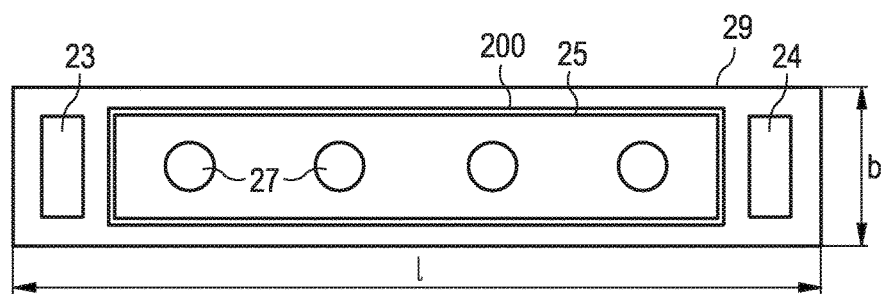
FIG. 1C shows one example of a semiconductor chip in schematic plan view.

FIG. 1C shows one example of a semiconductor chip in a schematic plan view of the radiation exit surface. The semiconductor chip can have, for example, a length 1 of approximately 1 mm and a width b of approximately 200 µm. In the completed component, the width b corresponds—apart from material removal in the singulating step—to the component height, that is to say the extent of the semiconductor component perpendicular to the mounting side surface 11.

In this example, the area that can be utilized to generate radiation, this area largely corresponding to the area of the first connection layer 25, can be approximately 0.09 mm$^2$, as a result of which a luminous flux of approximately 15 lumens can be achieved. Depending on the application of the semiconductor component, the length and width of the semiconductor chip can be varied within wide limits. For the smallest possible structural height in conjunction with sufficient radiation power, the width of the semiconductor chip is preferably 150 µm to 300 µm, particularly preferably 200 µm to 250 µm.

The number of recesses 27 can vary in particular depending on the length 1 of the semiconductor chip and on the transverse conductivity of the second semiconductor layer 22. In particular, just a single recess 27 can be sufficient.

A radiation conversion material can be formed on the semiconductor chip 2, and converts primary radiation generated in the semiconductor chip, in particular in the active region, at least partly into secondary radiation such that the semiconductor component overall emits a mixed radiation, for example, mixed light that appears white to the human eye (not illustrated explicitly). The radiation conversion material can be applied to the semiconductor chips 2 during fabrication in particular before the process of singulation in to semiconductor components.

Figure 1D:
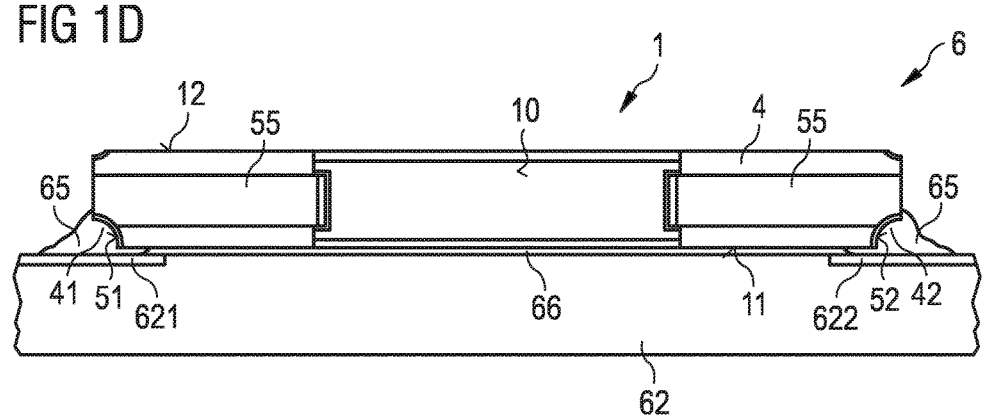
FIG. 1D shows one example of a backlighting module comprising a semiconductor component in schematic side view.

A module 6 comprising an above-described semiconductor component 1 is shown in schematic side view in FIG. 1D. The semiconductor component 1 is arranged at a connection carrier 62, for example, a printed circuit board, for instance an FR4 printed circuit board, wherein the mounting side surface 11 faces the connection carrier 62. Radiation emerging perpendicularly through the radiation exit surface 10 thus runs parallel to the connection carrier 62. The contact area 51 and the further contact area 52 electrically conductively connect to a first connection carrier area 621 and a second connection carrier area 622, respectively, by a solder 65. The solder regionally fills the indentation 41 and the further indentation 42. A gap possibly present between the semiconductor component 1 and the connection carrier 62 can be filled with an underfill 66. The mechanical stability and also the heat dissipation from the semiconductor component 1 can be improved as a result.

The semiconductor component described is particularly suitable for the lateral coupling of the radiation into an optical waveguide. The module can be designed in particular as a backlighting module of a liquid crystal display (not illustrated explicitly).

The second example illustrated in FIGS. 2A and 2B substantially corresponds to the first example described in association with FIGS. 1A to 1D. In contrast thereto, the semiconductor chip is not embodied as a thin-film semiconductor chip, but rather as a semiconductor chip in which the carrier 29 is formed by the growth substrate. By way of example, in a semiconductor layer sequence on the basis of III nitride compound semiconductor material, sapphire or silicon carbide is suitable as growth substrate. To avoid lateral coupling-out of radiation, the semiconductor chip is embedded into the molded body 4 at the side surfaces running perpendicularly to the radiation exit surface 10 and at the rear side opposite the radiation exit surface. In this example, the molded body expediently has a high reflectivity, preferably a reflectivity of at least 80% for the radiation generated in the semiconductor chip 2. By way of example, a polymer material, for instance silicone, which is filled with white pigments, for instance titanium oxide, is suitable for the molded bodies. As an alternative or in addition to a reflective molded body, the semiconductor chip can be provided with a reflective material at the side surfaces. This will be explained in greater detail in association with FIGS. 5A to 5C.

Figure 3A:
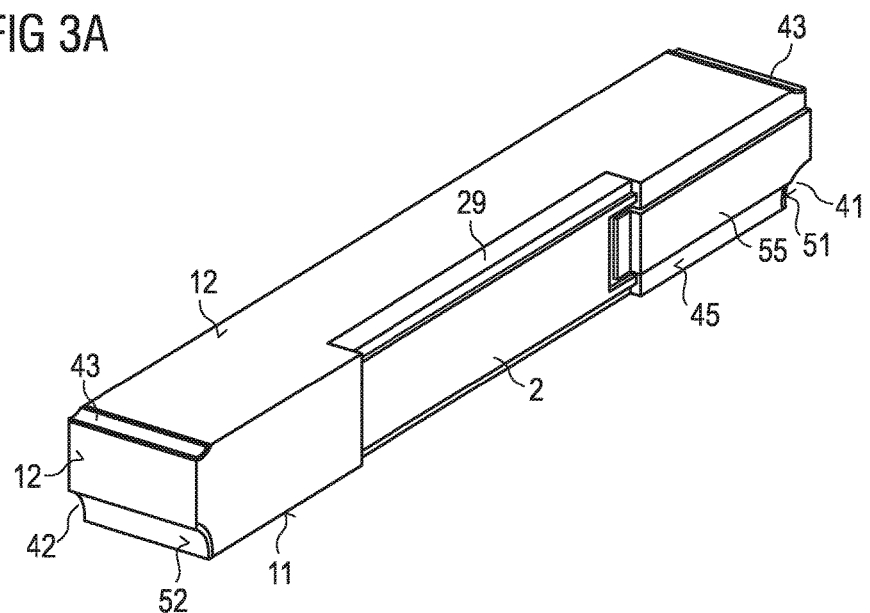
Figure 3B:
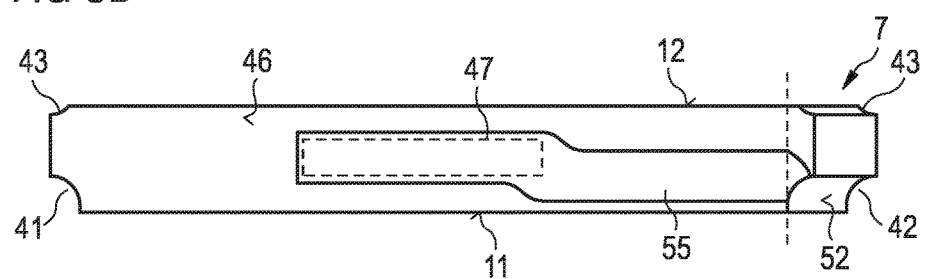
Figure 3C:
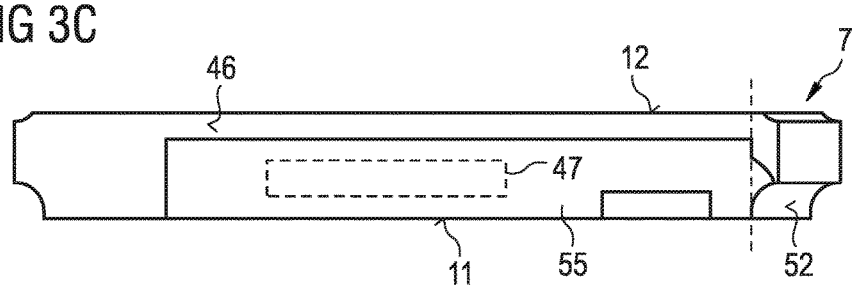
Figure 3D:
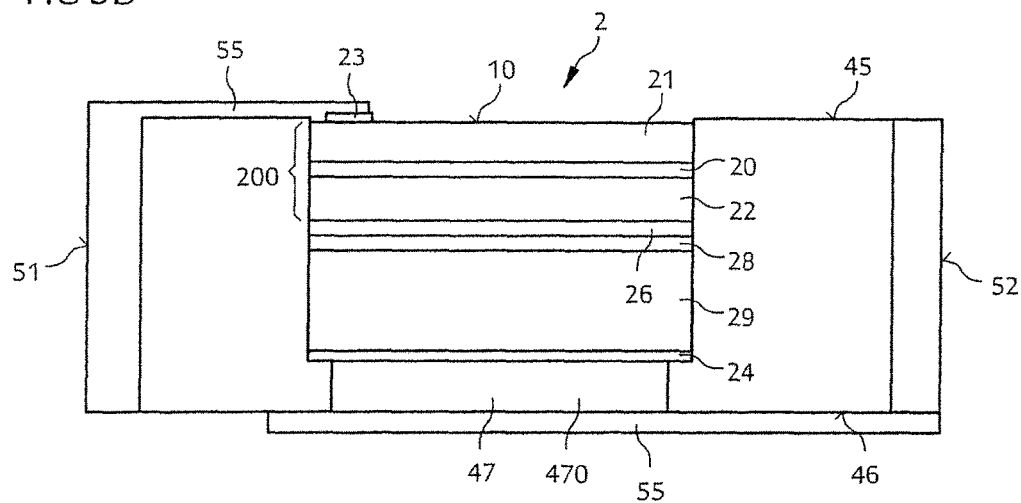

The third example illustrated in FIGS. 3A to 3D with variants in accordance with FIGS. 3B and 3C substantially corresponds to the first example described in association with FIGS. 1A to 1D. In contrast thereto, the semiconductor chip is a thin-film semiconductor chip in which the semiconductor chip has a front-side first contact 23 and a rear-side second contact 24 (FIG. 3D). The electrical contacting of the semiconductor layer sequence 200 is therefore carried out through the carrier 29. In this case, the carrier is expediently electrically conductive. By way of example, the carrier contains a doped semiconductor material, for instance silicon or germanium or a metal. The second connection layer 26 arranged between the semiconductor layer sequence 200 and the carrier is designed as a mirror layer for the radiation generated in the active region 20. In particular, the materials for the first connection layer as mentioned in association with FIG. 1B are suitable for the second connection layer. A first connection layer for electrically contacting the first semiconductor layer 21 is not necessary, but can additionally be provided. The term "second connection layer" thus denotes a connection layer electrically conductively connected to the second semiconductor layer, irrespective of whether or not a first connection layer is provided.

In this example, only one contact track 55 is formed on the front side 45 of the molded body. A contact opening 47 is formed in the molded body 4, the contact opening extending from the rear side 46 of the molded body as far as the semiconductor chip 2 such that the second contact 24 is accessible for electrical contacting. The further contact area 52 electrically conductively connects to the second contact 24 via a contact track 55 running on the layer side.

To form the contact opening 47, material of the molded body 4 can be removed during fabrication, for example, by laser radiation. Alternatively, the rear side of the carrier can already be kept free during formation of the molded body, for example, by a foil assisted transfer molding (FAM) method. The contact opening 47 can be filled completely or partly with a filling material 470, for example, a metal, for instance copper (FIG. 3D). As a result, heat loss arising during operation can be dissipated from the semiconductor chip 2 in an improved manner. The material of the contact track 55 can alternatively directly adjoin the second contact 24. The contact track 55 can run at a distance from the mounting side surface 11, as shown in FIG. 3B, or extend at least regionally as far as the mounting side surface 11, as shown in FIG. 3C. Heat dissipation to a connection carrier to which the semiconductor component is fixed can be improved as a result.

To enable improved illustration, partial regions 7 in which the further contact area 52 is formed are represented perspectively in a distorted fashion in FIGS. 3B and 3C such that the further contact area 52 is visible in each case.

Figure 3E:
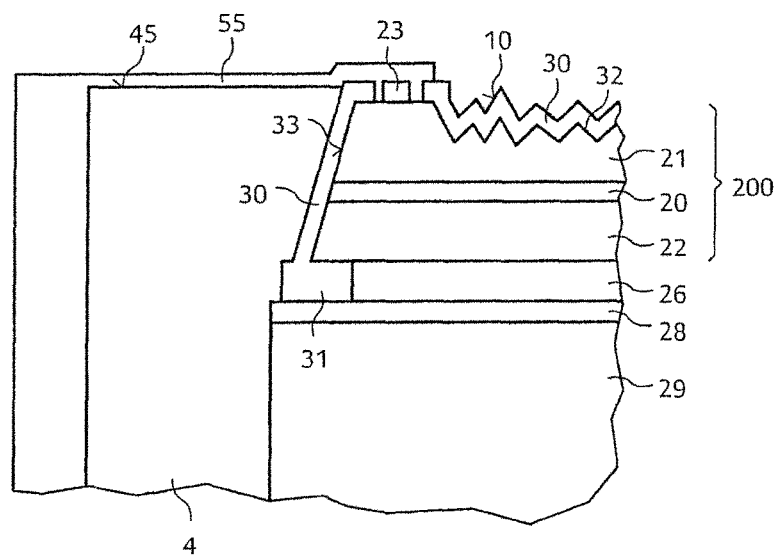

A detail illustration of one possible configuration of the sectional view is shown in FIG. 3E. The semiconductor chip 2 has an insulation layer 30 covering a side surface 33 of the semiconductor layer sequence 200. The molded body 4 directly adjoins the insulation layer. The second connection layer 26 has a smaller cross section than the semiconductor layer sequence 200 such that the second connection layer does not extend as far as the side surface 33 in a lateral direction. In this regard, a region 31 running around the second connection layer 26 arises. The region is filled with the insulation layer such that the insulation layer encapsulates the second connection layer along the entire circumference. The radiation exit surface 10 has a roughening 32 to increase the coupling-out efficiency.

Figure 3F:
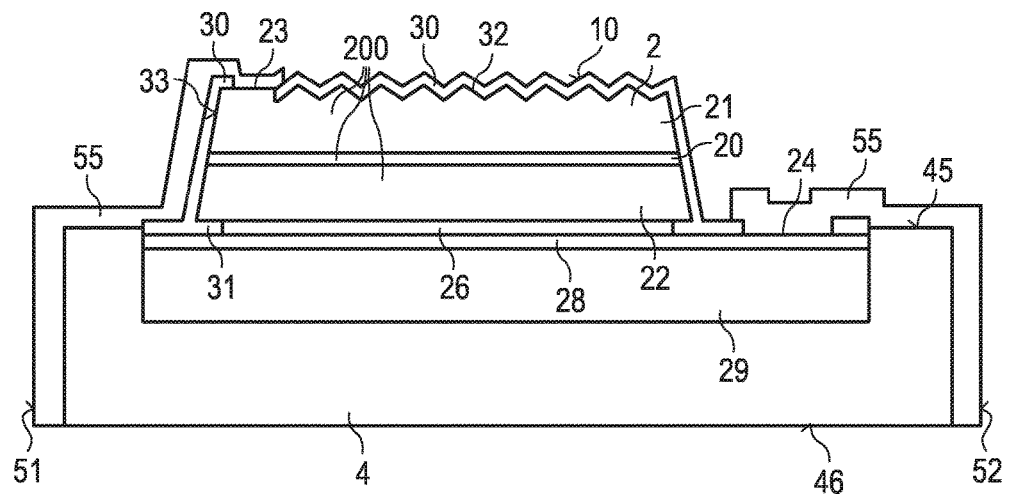
FIG. 3F shows a further example in schematic sectional view.

In the example shown in FIG. 3F, the semiconductor chip 2 is a thin-film semiconductor chip as described in association with FIGS. 3D and 3E. In contrast to the example shown in FIG. 3E, both contacts of the semiconductor chip are arranged on the front side, as described in association with FIG. 1B. Third contact tracks 55 run on the front side 45 of the molded body. A contact opening that exposes the rear side of the semiconductor chip is thus not required. A surface region of the first semiconductor layer sequence 21 forms a first contact 23 of the semiconductor chip 2. The contact track 55 directly adjoins this region of the first semiconductor layer. A region of the connecting layer 28 forms the second contact 24 of the semiconductor chip. The contact track 55 directly adjoins this region of the connecting layer 28. However, the contacts can also be an additional element, for instance a metal layer, as described in association with the figures above.

Furthermore, a side surface 33 of the semiconductor layer sequence 200 is free of the material of the molded body 4, in contrast to FIG. 3E. Radiation can thus also emerge from the semiconductor layer sequence laterally. The contact track 55 is led on the insulation layer 30 from the first semiconductor layer 21 over the side surface 33.

In a departure therefrom, however, the side surface of the semiconductor layer sequence 200 can also be covered with the molded body 4 in regions or completely.

Figure 3G:
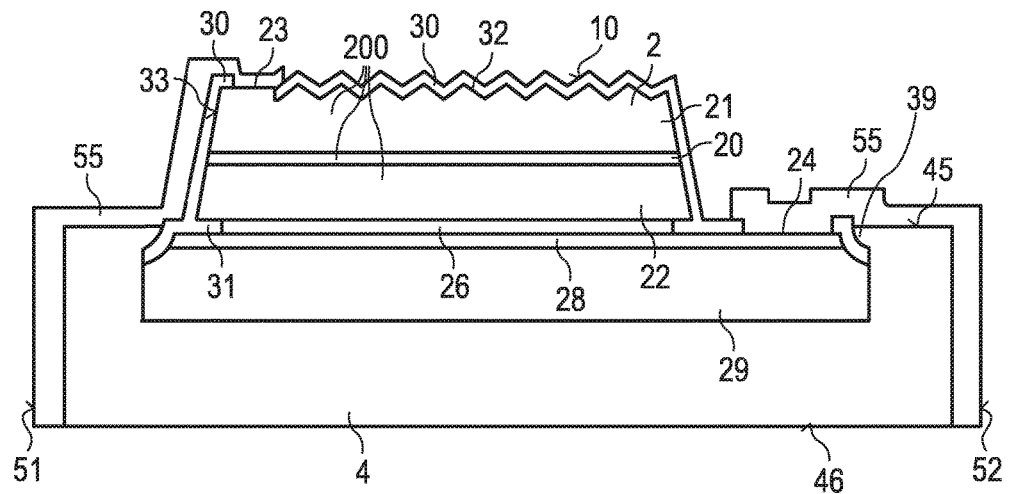
FIG. 3G shows a further example in schematic sectional view.

The example illustrated in FIG. 3G substantially corresponds to the example described in association with FIG. 3F. In contrast thereto, the semiconductor chip 2 has a depression 39. The depression runs at least in regions along the circumference of the semiconductor chip, for example, along the entire circumference of the semiconductor chip. In the example shown, the depression extends into the carrier. At the level of the depression 39, therefore, in plan view the semiconductor chip 2 has a smaller cross-sectional area than in the remaining region of the carrier. The insulation layer 30 is arranged in the region of the depression. A reliable electrical insulation between the carrier 29 and the contact track 55 is thus simplified. Furthermore, the molded body extends into the depression at least in regions. This brings about a positively locking connection between the semiconductor chip 2 and the molded body. The mechanical stability of the connection between the semiconductor chip 2 and the molded body 4 is increased as a result.

Figure 4C:
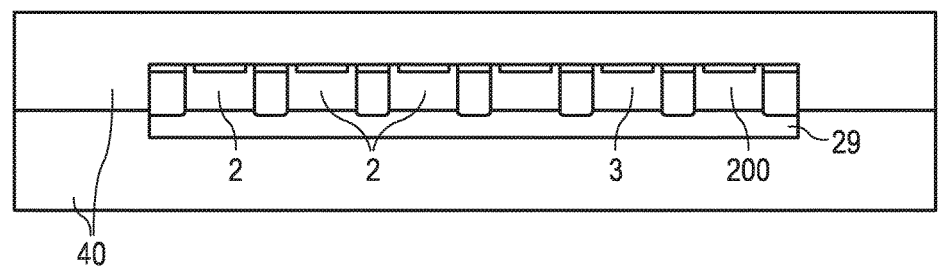
Figure 4D:
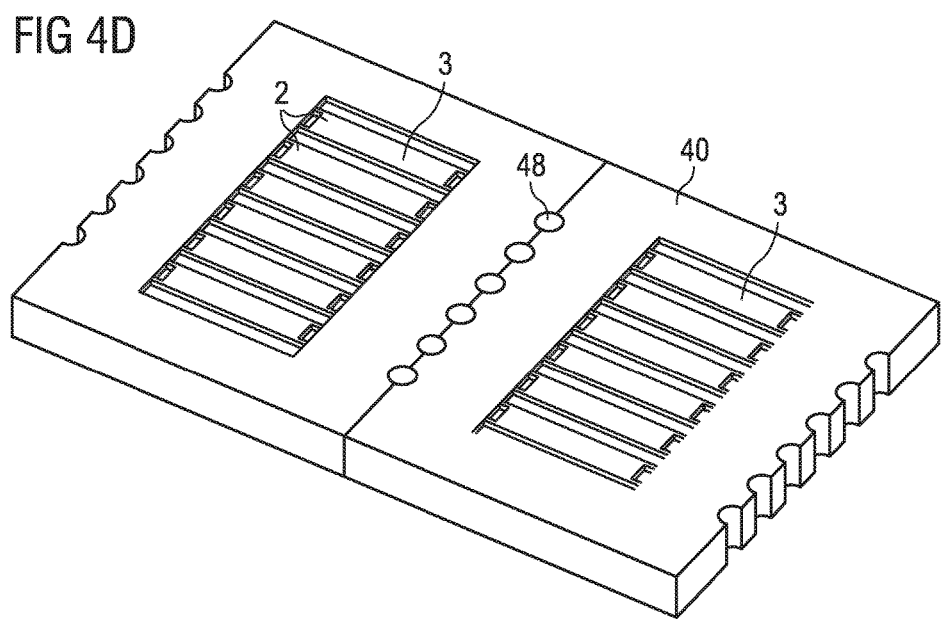
Figure 4E:
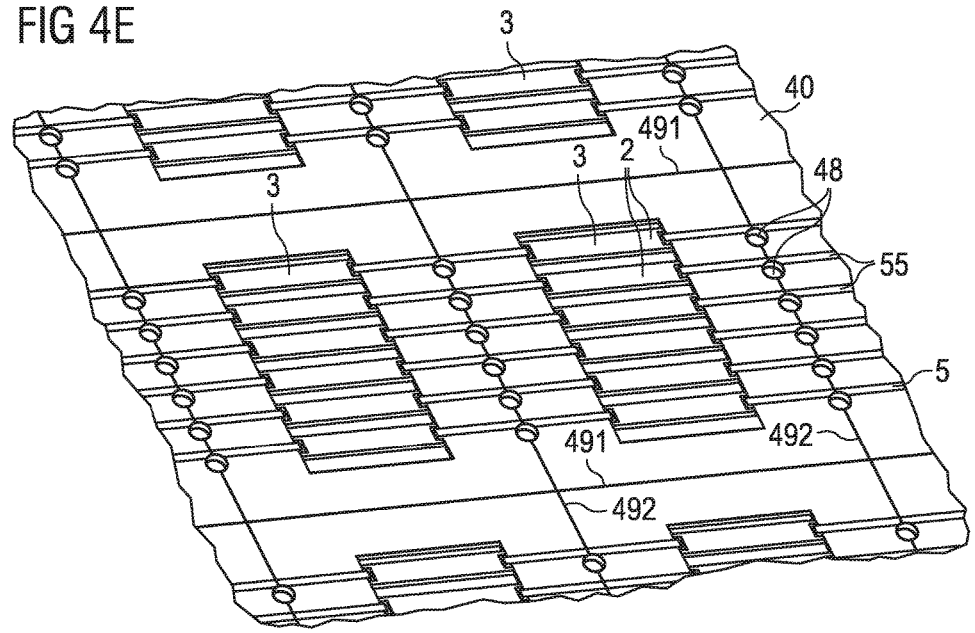

One example of a fabrication method is described with reference to FIGS. 4A to 4F, which method involves fabricating, by way of example, semiconductor components embodied as described in association with FIGS. 1A to 1B. For this purpose, a plurality of semiconductor chip assemblages 3 are provided, wherein FIG. 4A shows one semiconductor chip assemblage comprising, by way of example, six continuous semiconductor chips not yet singulated. The semiconductor layer sequences 200 of the semiconductor chips have already been separated from one another by trench-shaped recesses 34. The trench-shaped recesses form a mesa trench. However, the semiconductor layer sequences are still situated on a continuous carrier 29. A plurality of such semiconductor chip assemblages 3 are positioned at a distance from one another alongside one another, for example, in a matrix-shaped fashion. FIGS. 4B and 4D show only a region with two semiconductor chip assemblages 3 for the sake of simplified illustration. A larger excerpt revealing the matrix-shaped arrangement is illustrated in FIG. 4E. The positioning of such semiconductor chip assemblages is simplified in comparison with positioning semiconductor chips that have already been singulated.

As illustrated in FIG. 4B, the semiconductor chip assemblages 3 are encapsulated with a molding compound such that the radiation exit surfaces 10 of the semiconductor chips 2 remain free of the molding compound. FIG. 4C shows a perspectively depicted sectional view through the fabrication stage illustrated in FIG. 4B along the line CC'. A molded body assemblage 40 is formed by a molding compound from which molded body assemblage the individual molded bodies of the semiconductor components emerge in a later singulating step.

As shown in FIG. 4D, recesses 48 are formed into the molded body assemblage 40 between adjacent semiconductor chips of different semiconductor chip assemblages 3. The recesses can extend completely through the molded body assemblage, as illustrated in the figure. In a departure therefrom, however, it is also possible to form the recesses 48 as blind holes. The position of the recesses can be corrected by the deviation tolerances during the positioning of the semiconductor chip assemblages, for example, by recording an image and forwarding the evaluated image information to the process that forms the recesses, for example, a laser process.

A coating 5 is subsequently formed on the molded body assemblage, wherein contact tracks 55 that electrically contact the semiconductor chips 2 are formed by the coating 5. Furthermore, the coating also covers the inner surfaces of the recesses 48. The contact tracks 55 therefore connect the contacts of the semiconductor chips to the coated recesses 48. To form the contact tracks, a protective resist can be applied and structured. The exposed places of the molded body assemblage can be covered with a seed layer, for example, by vapor deposition or sputtering, the seed layer can subsequently be chemically amplified, for example, electrolytically such that the contact tracks have a sufficiently high current-carrying capacity.

Figure 4F:
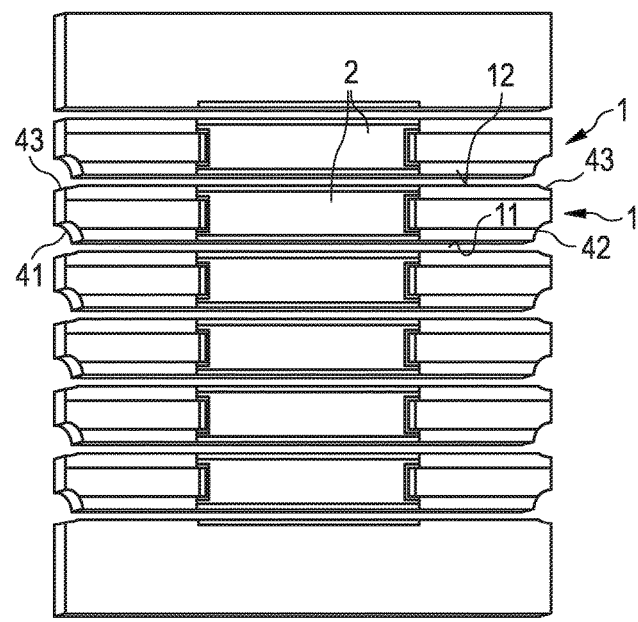

Afterward, the molded body assemblage, as illustrated in FIGS. 4E and 4F, is singulated along first separating lines 491 running parallel to one another and second separating lines 492 running perpendicularly thereto, for example, by sawing or laser separation. A singulation direction of the first separating lines runs along the mesa trenches between the semiconductor layer sequences 200 of adjacent semiconductor chips of a semiconductor chip assemblage 3. Both the material of the molded body assemblage and the carrier 29 of the semiconductor chip assemblage are severed in this singulating step. This gives rise to side surface 12 of the semiconductor component, in particular the mounting side surface 11, in which the molded bodies 4 arising as a result of the singulation and the semiconductor chips 2 terminate flush with one another. This first singulating step is additionally carried out such that the recesses 48 are severed. In this regard, at a mounting side surface 11 for each molded body, an indentation 41 and a further indentation 42 arise, in which a contact area 51 and a further contact area 52, respectively, are accessible for external electrical contacting.

Perpendicularly to the first singulation direction, a singulation along a second singulation direction is carried out, wherein the singulation is likewise carried out through the recesses 48. As a result, the molded bodies 4 acquire a rectangular basic shape in which an indentation is arranged in each of the corners. In a departure therefrom, however, the second singulation direction can also be implemented laterally with respect to the recesses. In this case, the indentations are not arranged in the corners of the molded body.

A first simulating step running through the semiconductor chip assemblages and a second simulating step running between adjacent semiconductor chip assemblages are thus carried out. In this case, the designations "first and second singulation directions" and "first and second singulating steps" do not employ an order with regard to carrying out the singulating steps.

The side surfaces 12 of the molded body 4, in particular the mounting side surface 11, arise only during the process of singulating the molded body assemblage 40 and thus also after the coating has been applied. The side surfaces are therefore free of material of the coating 5. The completed semiconductor components 1 are electrically contactable at the mounting side surface via the coating present in the indentations 41, 42.

In a departure from the example described, the semiconductor chip assemblage can also be singulated in a method step upstream of the process of singulating the molded body assemblage. This is shown in FIGS. 5A to 5C on the basis of an excerpt in schematic sectional view. For this purpose, after the molded body assemblage 40 has been formed, trenches 35 can be formed between adjacent semiconductor chips of a semiconductor assemblage. The trenches run along the trench-shaped recesses 34 between adjacent semiconductor layer sequences 200. In a departure therefrom, it is also possible for the semiconductor layer sequences 200 to be separated from one another only during the process of forming the trenches 35. The trenches 35 extend perpendicularly to the main extension plane of the active region completely through the semiconductor chip assemblage 3 such that the semiconductor chips are singulated. However, the trenches end in the material of the molded body assemblage such that the individual semiconductor chips are still held together by the molded body assemblage. The trenches can then be provided with a reflective material 36 such that the side surfaces of the semiconductor chips are not exposed. The semiconductor chip assemblage is then singulated along these trenches, wherein the width of a separating trench 49 is less than the width of the trench formed previously such that the reflective material 36 applied in the trenches covers the side surfaces of the semiconductor chips, in particular the side surface of the respective carriers 29, also after the singulating step. By way of example, a coating method, for instance vapor deposition of a metal layer, for example, silver or molding is suitable to apply the reflective material. With the upstream singulation of the semiconductor chip assemblage 3, the side surfaces of the semiconductor chips can also be covered with reflective material at the side surfaces 12 that arise during the singulation of the molded body assemblage such that undesired coupling-out of radiation through these side surfaces can be avoided. This variant is suitable in particular for semiconductor chips in which a significant proportion of radiation could emerge through the side surfaces of the carrier, for example, in semiconductor chips which have a portion of the growth substrate as carrier. The remaining method steps can be carried out as described in association with FIGS. 4A to 4F.

Figure 6A:
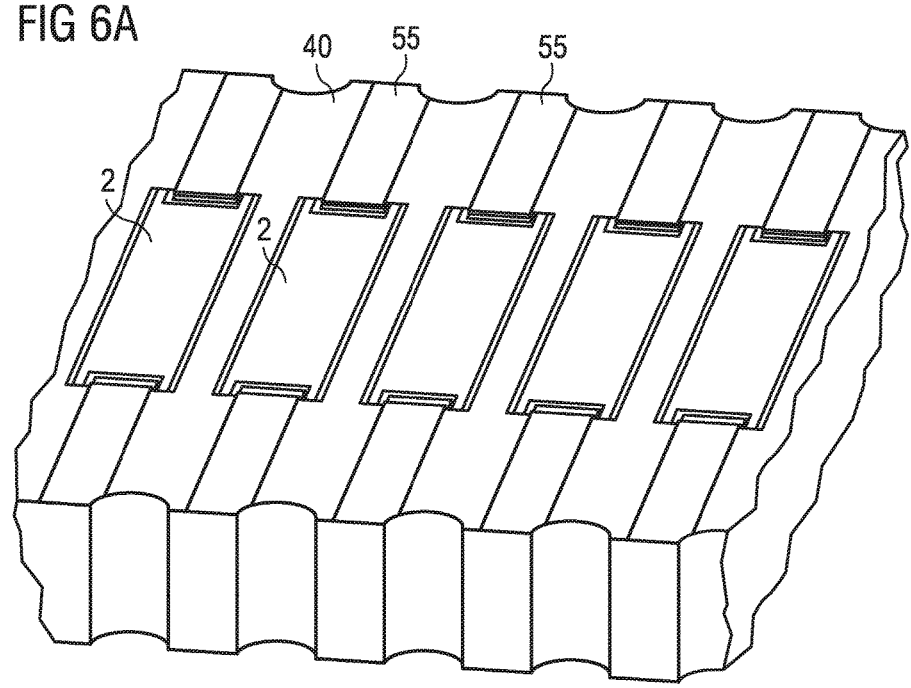
FIGS. 6A and 6B show one example of a method of fabricating a semiconductor component on the basis of a perspectively illustrated intermediate step in FIG. 6A and a completed semiconductor component in side view in FIG. 6B.
Figure 6B:
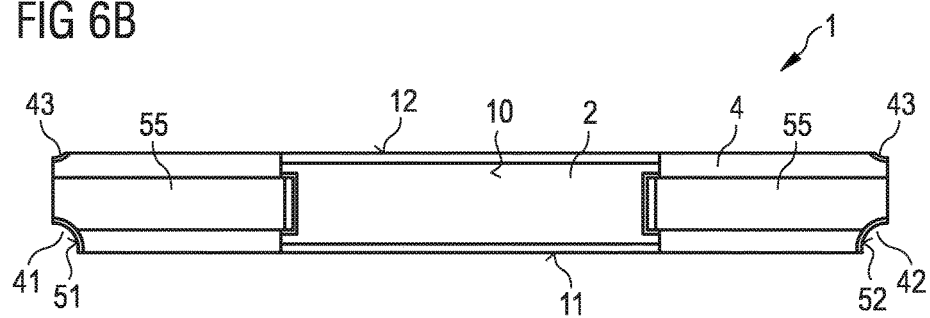

In the example shown with reference to FIGS. 6A and 6B, in contrast to the previous examples, the semiconductor chips are provided in already singulated form and are encapsulated with a molding compound at least in regions, as described in association with FIG. 4B. In this variant, the area of the epitaxy wafer on which the semiconductor layer sequence 200 of the semiconductor chips 2 is formed can be better utilized compared to the examples described above. In this case, the molding compound can be molded onto all side surfaces of the semiconductor chips. Before the semiconductor chips are encapsulated, they can already be covered with a reflective material, for example, a metal at the sides that are to be encapsulated (cf. FIG. 5B). This can be carried out, for example, by a metal vapor deposition after the singulation of the semiconductor chips onto an expanded foil frame such that the side surfaces that arise during the singulation of the semiconductor chips are accessible for the vapor deposition. In this case, a material having a lower reflectivity can also be used for the molded body, without resulting in losses in the optical output power of the semiconductor components.

Semiconductor components which are distinguished by a particularly small structural height and simultaneously allow optimum coupling even into thin optical waveguides can be fabricated in a simple and cost-effective manner with the methods described.

Our components and methods are not restricted by the description on the basis of the examples. Rather, this disclosure encompasses any novel feature and also any combination of features, which in particular includes any combination of features in the appended claims, even if the feature or combination itself is not explicitly specified in the claims or the examples.

The invention claimed is:

1. An optoelectronic semiconductor component comprising:
   a semiconductor chip having a semiconductor layer sequence comprising an active region that generates radiation;
   a radiation exit surface running parallel to the active region;
   a mounting side surface that fixes the semiconductor component and runs obliquely or perpendicularly to the radiation exit surface and at which at least one contact area for external electrical contacting is accessible;
   a molded body that is molded onto the semiconductor chip and forms the mounting side surface at least in regions; and
   a contact track arranged on the molded body and electrically conductively connecting the semiconductor chip to the at least one contact area,
   wherein the semiconductor chip has a carrier on which the semiconductor layer sequence is arranged,
   the carrier only consisting of sapphire, silicon carbide, silicon or germanium,
   the molded body covers at least in regions a rear side of the carrier facing away from the semiconductor layer sequence, and
   the carrier and the molded body terminate flush at at least one side surface of the semiconductor component.

2. The semiconductor component according to claim 1, wherein the semiconductor component has a rectangular basic shape with at least one indentation in a plan view of the radiation exit surface, and the at least one contact area is arranged in the at least one indentation.

3. The semiconductor component according to claim 2, wherein the at least one indentation is arranged in a corner of the rectangular basic shape and a further indentation is formed at a further corner, and the mounting side surface runs between the corner and the further corner and a further contact area of the semiconductor component is arranged in the further corner.

4. The semiconductor component according to claim 1, wherein the molded body adjoins all side surfaces of the carrier.

5. The semiconductor component according to claim 1, wherein the semiconductor chip has a contact on a front side of the carrier facing the semiconductor layer sequence and a further contact on the rear side of the carrier facing away from the semiconductor layer sequence, said further contact connected to a further contact area via a further contact track, and the contact track and the further contact track run on opposite surfaces of the molded body.

6. The semiconductor component according to claim 1, wherein the molded body is reflective of the radiation generated in the semiconductor chip.

7. The semiconductor component according to claim 1, wherein the molded body is non-transmissive for the radiation generated in the active region and is molded onto the semiconductor chip such that the molded body directly adjoins the semiconductor chip at places.

8. The semiconductor component according to claim 1, wherein the molded body extends perpendicularly to the radiation exit surface between a rear side of the molded body opposite the radiation exit surface and a front side of the molded body, and the contact track runs on the front side of the molded body.

9. The semiconductor component according to claim 1, wherein the molded body completely covers the rear side of the carrier.

10. The semiconductor component according to claim 1, wherein the carrier is part of the semiconductor chip.

11. The semiconductor component according to claim 7, wherein the carrier is part of the semiconductor chip.

* * * * *